United States Patent

Jo

[11] Patent Number: 6,160,364
[45] Date of Patent: Dec. 12, 2000

[54] CIRCUIT FOR LIMITING HORIZONTAL IMAGE SIZE OF DISPLAY

[75] Inventor: Sang-Soo Jo, Siheung, Rep. of Korea

[73] Assignee: SamSung Electronics Co., Ltd., Suwon, Rep. of Korea

[21] Appl. No.: 09/134,379

[22] Filed: Aug. 14, 1998

[30] Foreign Application Priority Data

Sep. 30, 1997 [KR] Rep. of Korea ............... 9-27418 U

[51] Int. Cl.$^7$ .............................. G09G 1/04; H01J 29/70
[52] U.S. Cl. ........................ 315/387; 315/408; 315/399
[58] Field of Search ................................. 315/387, 369, 315/408, 399, 371

[56] References Cited

U.S. PATENT DOCUMENTS

| 4,081,721 | 3/1978 | HaFerl | 315/389 |
| 5,420,484 | 5/1995 | Morrish | 315/408 |
| 5,466,993 | 11/1995 | Leaver | 315/411 |
| 5,831,398 | 11/1998 | Kim | 315/371 |

*Primary Examiner*—Seungsook Ham
*Assistant Examiner*—John Patti
*Attorney, Agent, or Firm*—Robert E. Bushnell, Esq.

[57] ABSTRACT

A circuit fixedly limits the horizontal image size of a screen of a CRT display. The circuit for limiting the horizontal image size of the screen detects a voltage indicative of the horizontal image size of the screen with power provided to a horizontal output unit by a field effect transistor in a horizontal output power supply unit. A current mirror circuit coupled to the field effect transistors outputs current which flows into the drain of a field effect transistor when the field effect transistor is turned on. The outputted current is transformed into voltage and the voltage is fed back to the PWM control circuit to limit the horizontal image size of the screen.

9 Claims, 2 Drawing Sheets

CIRCUIT FOR LIMITING HORIZONTAL IMAGE SIZE OF DISPLAY

BACKGROUND OF THE INVENTION

Claim of Priority

This application makes reference to, incorporates the same herein, and claims all benefits accruing under 35 U.S.C. §119 from an application for CIRCUIT FOR LIMITING HORIZONTAL IMAGE SIZE OF DISPLAY BACKGROUND OF THE INVENTION earlier filed in the Korean Industrial Property Office on Sept. 30, 1997 and there duly assigned Serial No. 27418/1997.

Technical Field

The present invention relates to a circuit for limiting the horizontal image size of display, and more particularly to a circuit for limiting the horizontal image size of a viewing screen of a cathode ray tube (CRT) display used in connection with a computer system.

Related Art

A display is usually used for monitoring the operating state of a computer system. The computer system outputs predetermined video signals indicative of a presently implemented operation by a video card embedded in the computer system. Further, video signals outputted from the computer system are inputted to a display to form an image on the screen of a CRT.

A computer system makes use of vertical and horizontal synchronization signals outputted along with the video signals so that the video signals outputted from the video card in the computer system are inputted to a display to form an image on the screen.

A CRT comprises an electron gun supported in a CRT neck from which an electron beam emanates. Additionally, the CRT controls vertical and horizontal deflection of the beam in response to the vertical and horizontal synchronization signals, respectively, to show an image on the screen.

In the case of horizontal deflection of the electron beam in response to the horizontal synchronization signals, excessive current flows into a horizontal output transistor which outputs horizontal deflection signals to a horizontal deflection yoke (HDY) if the horizontal image size of screen is larger than a predetermined value. Therefore, the horizontal output transistor can be damaged by excessive current.

As a result, a display typically comprises a circuit for limiting horizontal image size of CRT screen in order to protect the display circuit. Such a circuit typically includes a pulse width modulation (PWM) control circuit, a horizontal output power supply unit, a horizontal driver, and a horizontal output unit. The horizontal output power supply unit typically employs a field effect transistor (FET), while the horizontal output unit typically employs a horizontal output transistor.

The latter circuit has disadvantages, as follows. The circuit detects current flowing through the horizontal output transistor operating at high voltage and large current, and feeds the current transformed into voltage back to the PWM control circuit to determine the horizontal image size of the screen. Accordingly, the circuit in question has numerous errors in its detected voltage, the latter being indicative of the horizontal image size of the screen. Furthermore, noise produced by line impedance matching is also applied to the PWM control circuit, along with detected voltage, and this causes defects in the image on the screen. Accordingly, user dissatisfaction and lack of reliability of the product result.

SUMMARY OF THE INVENTION

It is an object of the present invention to provide a circuit for limiting horizontal image size of a display by accurately detecting voltage indicative of horizontal image size without using current flowing through a horizontal output transistor, and then by feeding the voltage back.

It is another object of the present invention to provide a circuit for limiting horizontal image size of display wherein defects in the screen image are reduced by preventing noise from switching high voltage and large current, and also pattern length in mask gets shorter.

To achieve the above-mentioned objects, a circuit for limiting a horizontal image size of display comprises a horizontal driver for amplifying and outputting horizontal pulse signals, PWM control means for producing PWM signals for adjustment of horizontal image size of screen, horizontal output power supply means for supplying driving power in response to the PWM signals outputted from the PWM control means, horizontal output means for controlling horizontal deflection of an electron beam by the driving power supplied by the horizontal output power supply means, the horizontal output means being driven in response to the horizontal pulse signals from the horizontal driver, and a current mirror circuit for detecting voltage signals indicative of the horizontal image size of the screen and for inputting the voltage signals to the PWM control means.

The current mirror circuit in the present invention outputs current flowing into the drain of a field effect transistor in the horizontal output power supply unit, and applies the outputted current transformed into voltage to the PWM control circuit when the field effect transistor is turned on.

Further objects, features and other aspects will be understood from the following detailed description of preferred embodiments of the present invention referring to the accompanying drawings.

BRIEF DESCRIPTION OF THE DRAWINGS

A more complete appreciation of the invention, and many of the attendant advantages thereof, will be readily apparent as the same becomes better understood by reference to the following detailed description when considered in conjunction with the accompanying drawings in which like reference symbols indicate the same or similar components, wherein.

DETAILED DESCRIPTION OF PREFERRED EMBODIMENTS

The present invention will now be described in detail referring to the accompanying drawings.

Figure 1:
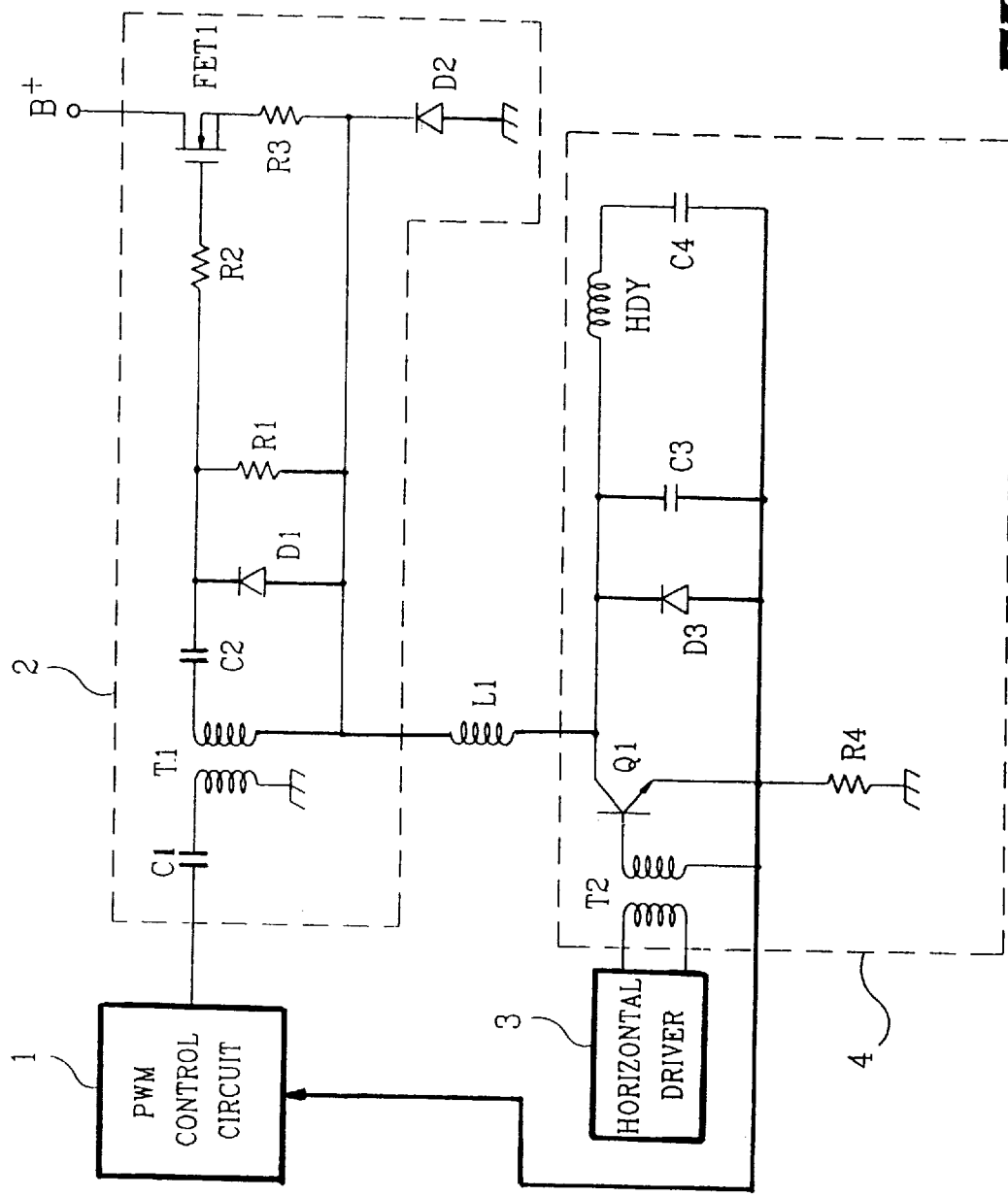
FIG. 1 is a schematic block diagram of a circuit for limiting horizontal image size of the screen of a display.

FIG. 1 is a schematic diagram setting forth a circuit for limiting horizontal image size. Reference numeral 1 indicates a pulse width modulation (PWM) control circuit, which outputs PWM signals in synchronization with horizontal pulse signals, and then adjusts the width of the PWM signal in response to the level of feedback voltage fed back to the PWM control circuit. Reference numeral 2 designates a horizontal output power supply unit providing horizontal output unit 4 with driving power. In the horizontal output power supply unit 2, the output of PWM control circuit 1 is coupled to the primary winding of transformer T1 via capacitor C1. Further, the secondary winding of transformer T1 is coupled to capacitor C2, to which the parallel arrangement of diode D1 and resistor R1 is connected. The junction of capacitor C2, resistor R1, and diode D1 is operatively coupled to the gate of field effect transistor FET1 via resistor R2. The drain of field effect transistor FET1 is coupled to power source B+. The source of field effect transistor FET1 is coupled to resistor R3, which is commonly coupled to the secondary winding of transformer T1, the anode of diode D1, resistor R1, and the cathode of diode D2. The anode of diode D2 is grounded. Driving power from power source B+ is applied to horizontal output unit 4 via inductance L1 coupled between horizontal output unit 4 and the junction of resistor R3 and the secondary winding of transformer T1.

Reference numeral 3 designates a horizontal driver that amplifies and outputs horizontal pulse signals. Reference numeral 4 designates a horizontal output unit that controls horizontal deflection in response to the horizontal pulse signal outputted from horizontal driver 3. In the horizontal output unit 4, the base of horizontal output transistor Q1 is coupled to the output of horizontal driver 3 via transformer T2. Furthermore, the collector of transistor Q1 is coupled to inductance L1 so that driving power is applied to horizontal output unit 4. The collector of transistor Q1 is also coupled to the cathode of diode D3, capacitor C3, and horizontal deflection yoke HDY. Horizontal deflection yoke HDY is coupled to capacitor C4, which is commonly coupled to the anode of diode D3, capacitor C3, and the junction of the emitter of transistor Q1 and resistor R4. The junction of the emitter of transistor Q1 and resistor R4 is coupled to the secondary winding of transformer T2 and to the input of PWM control circuit 1.

A circuit for limiting horizontal image size constructed as described above outputs PWM signals in synchronization with horizontal pulse signals from PWM control circuit 1.

Capacitor C1 in the horizontal output power supply unit 2 removes a direct current (DC) component of the PWM signals outputted from the PWM control circuit 1. Transformer T1 transforms the PWM signals into a level sufficient to drive field effect transistor FET1. Capacitor C2 removes again the DC component of the PWM signals thus transformed, which signals are applied to the gate of field effect transistor FET1 via resistor R2.

As field effect transistor FET1 is turned on by the applied PWM signal, driving power from power source B+ is provided to horizontal output unit 4 via field effect transistor FET1, excessive current prevention resistor R3, and inductance L1. Resistor R2 functions to prevent oscillation of field effect transistor FET1. When field effect transistor FET1 is turned on, diode D1 functions to adjust the voltage difference between the gate and source of field effect transistor FET1 such that the voltage difference is equivalent to the level of PWM signals applied to the field effect transistor FET1 via capacitor C2. In such a state as described above, horizontal driver 3 outputs horizontal pulse signals, which signals are applied to the base of horizontal output transistor Q1 via transformer T2 in the horizontal output unit 4.

Horizontal output transistor Q1 is repeatedly turned on and off in response to the horizontal output signal. Predetermined horizontal deflection current is applied to horizontal deflection yoke HDY to produce a horizontal deflection magnetic field in response to horizontal output transistor Q1 being turned on and off, which field deflects the electron beam horizontally. When the horizontal output transistor Q1 is turned on, current is applied from inductance L1 to resistor R4 via transistor Q1. The horizontal image size of the screen is adjusted in response to the current applied to resistor R4, which current is transformed into a voltage indicative of horizontal image size to be detected at resistor R4. Voltage between both terminals of resistor R4 is applied to the input of PWM control circuit 1. PWM control circuit 1 determines the level of applied voltage and restrains variation in the outputted PWM signals to limit the horizontal image size of the screen if the level of voltage is greater than a predetermined value.

More particularly, horizontal output power supply unit 2 applies driving power to horizontal output unit 4 in response to PWM signals, which signals are outputted from PWM control circuit 1 in synchronization with horizontal pulse signals. Horizontal output transistor Q1 is turned on in response to the horizontal pulse signals outputted from horizontal driver 3. If current applied to horizontal output unit 4 is greater than a predetermined value, PWM control circuit 1 restricts the power applied to horizontal output unit 4 by restraining variation of the PWM signals, thereby limiting horizontal image size of the CRT screen.

However, the circuit described above has disadvantages as follows. The circuit detects current flowing through horizontal output transistor Q1 operating at high voltage and large current, and feeds the current transformed into voltage back to PWM control circuit 1 to determine the horizontal image size of screen. Accordingly, the circuit has a lot of errors in its detected voltage which is indicative of the horizontal image size of the screen. Further, noise produced by line impedance matching is also applied to the PWM control circuit 1, along with detected voltage, to cause defects in the image of the screen. As a result, the user is dissatisfied and the reliability of the product suffers.

Figure 2:
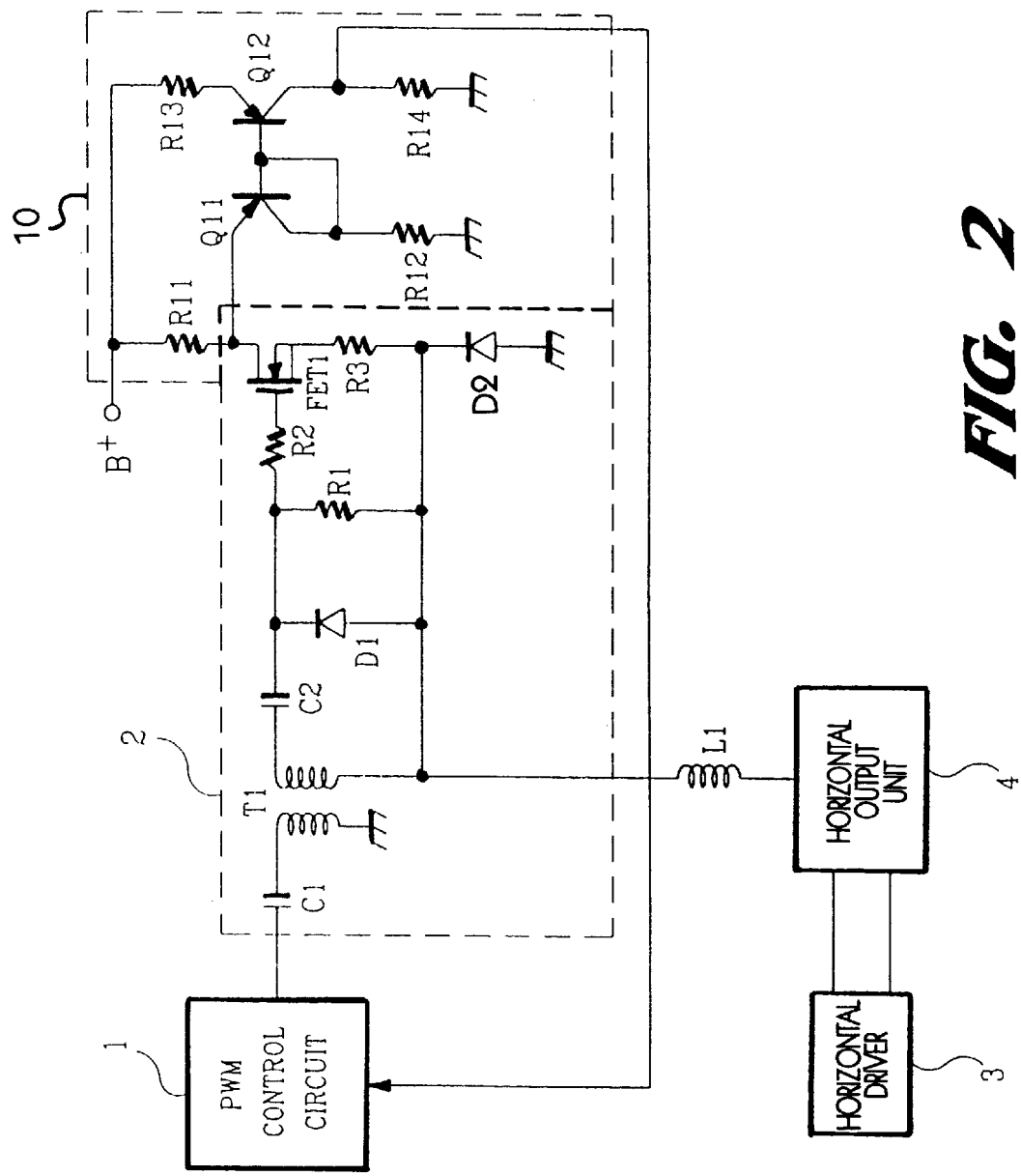
FIG. 2 is a schematic block diagram of a circuit for limiting horizontal image size of the screen of a display constructed in accordance with the present invention.

FIG. 2 is a schematic block diagram of an embodiment according to the present invention, wherein reference numerals corresponding to the numerals used in FIG. 1 are used to identify identical components. As illustrated in FIG. 2, the present invention comprises a current mirror circuit 10 which outputs current flowing into the drain of field effect transistor FET1 of horizontal output power supply unit 2. The current mirror circuit 10 detects the outputted current and feeds it back to PWM control circuit 1. In the current mirror circuit 10, power source B+ is coupled to resistor R11 which is coupled to the drain of field effect transistor FET1 and the emitter of transistor Q11. The base of transistor Q11 is commonly coupled to the base of transistor Q12, the collector of transistor Q11, and resistor R12. The emitter of transistor Q12 is coupled to power source B+ via resistor R13, and the collector of transistor Q12 is coupled to resistor R14 and to the input of PWM control circuit 1.

In the present invention described above, field effect transistor FET1 is turned on and off in response to PWM signals, as in the circuit of FIG. 1, when PWM control circuit 1 outputs PWM signals. When field effect transistor FET1 is turned on, driving power from power source B+ is applied to horizontal output unit 4 via field effect transistor FET1, excessive current prevention resistor R3, and inductance L1. If field effect transistor FET1 is turned off, driving power flows into ground via resistor R11, transistor Q11, and resistor R12. The value of resistor R11 is set to be very low, preferably less than 1ω. The voltages between resistor R11 and the emitter and base, respectively, of transistor Q11 correspond to those between resistor R13 and the emitter and base, respectively, of transistor Q12. The value of resistor R13 is set to be much higher than that of resistor R11, which is intended to substantially impede the flow of current applied to the collector of transistor Q12. In this situation, driving power is applied to field effect transistor FET1 via resistor R11 when field effect transistor FET1 is turned on. Voltage between both terminals of resistor R13 is equal to voltage between both terminals of resistor R11, whereby current flowing through resistor R13 increases in proportion to current flowing through resistor R11. Current flowing through resistor R13 is applied to resistor R14 via transistor Q12, and voltage between both terminals of resistor R14 is applied to the input of PWM control circuit 1. Accordingly, PWM control circuit 1 determines the horizontal image size of the CRT screen by feedback voltage fed back to PWM control circuit 1 from current mirror circuit 10, and then limits the horizontal image size of the screen by adjusting the outputted PWM signals in response to the determined horizontal image size.

As described above, the present invention detects the horizontal image size of the screen not by high voltage and large current applied to the horizontal output transistor Q1 in the horizontal output unit 4, but rather by current outputted from the horizontal output power supply unit 2, which provides horizontal output unit 4 with driving power. The present invention then feeds the detected horizontal image size back to the PWM control circuit and limits the horizontal image size of the screen. Thus, the present invention detects the horizontal image size of screen accurately, and further controls the horizontal image size of the screen exactly, so that it prevents damage to the horizontal output transistor Q1 and reduces defects in the screen image by reducing switching noise and making pattern length in the mask shorter.

While this invention has been described in connection with what is presently considered to be the most practical and preferred embodiment, it is to be understood that the invention is not limited to the disclosed embodiments, but, on the contrary, is intended to cover various modifications and equivalent arrangements included within the spirit and scope of the appended claims.

What is claimed is:

1. A circuit for limiting horizontal image size of a display comprising:

a horizontal driver for amplifying and outputting horizontal pulse signals;

PWM control means for producing PWM signals for adjustment of the horizontal image size of the display;

horizontal output power supply means that uses a transistor switch and is connected to said PWM control means for supplying driving power in response to the PWM signals outputted from the PWM control means;

horizontal output means connected to said horizontal output power supply means for controlling horizontal deflection of an electron beam in accordance with the driving power supplied by the horizontal output power supply means, said horizontal output means being driven in response to the horizontal pulse signals from the horizontal driver; and a current mirror circuit connected between said transistor switch of said horizontal output power supply means and a feedback input of said PWM control means for detecting signals indicative of the horizontal image size of the display, and for feeding the detected signals back to the feedback input of said PWM control means.

2. The circuit according to claim 1, wherein said transistor switch comprises a field effect transistor having a drain, a gate and a source, the field effect transistor being turned on and off in response to the PWM signals produced by the PWM control means, and wherein the signals indicative of the horizontal image size of the display are provided by current applied to the drain of the field effect transistor.

3. The circuit according to claim 2, wherein the current mirror circuit comprises:

a first resistor coupled to a power source;

a second resistor coupled to the power source and in parallel with the first resistor;

a first transistor having an emitter, a base and a collector, the emitter of the first transistor being coupled to a junction between the drain of the field effect transistor and the first resistor;

a third resistor coupled between the collector of the first transistor and ground;

a second transistor having an emitter, a base and a collector, the base of the second transistor being commonly coupled to the base of the first transistor and to a junction between the collector of the first transistor and the third resistor, the emitter of the second transistor being coupled to the second resistor; and a fourth resistor coupled to the collector of the second transistor, a junction between the fourth resistor and the collector of the second transistor being coupled to the feedback input of the PWM control means.

4. A circuit for limiting horizontal image size of a display, comprising:

horizontal driver means for amplifying and outputting horizontal pulse signals;

control and power supply means that uses a transistor switch for supplying driving power in response to a feedback control input;

horizontal output means for controlling horizontal deflection of an electron beam in accordance with the driving power supplied by the control and power supply means, said horizontal output means being driven in response to the horizontal pulse signals from said horizontal driver means; and current mirror circuit means connected between said transistor switch of said horizontal output means and said feedback control input of said control and power supply means for detecting signals indicative of the horizontal image size of the display, and for feeding the detected signals back to the feedback control input of the control and power supply means.

5. The circuit according to claim 4, wherein said control and power supply means comprises a pulse width modulation (PWM) control circuit for providing PWM signals for adjustment of the horizontal image size of the display, and a horizontal output power supply circuit for supplying the driving power in response to the PWM signals provided by the PWM control circuit.

6. The circuit according to claim 5, wherein said transistor switch comprises a field effect transistor having a drain, a gate and a source, said field effect transistor being turned on and off in response to the PWM signals provided by the PWM control circuit.

7. The circuit according to claim 6, wherein the signals indicative of the horizontal image size of the display are provided by current applied to the drain of the field effect transistor.

8. The circuit according to claim 4, wherein said current mirror circuit means comprises:

a first resistor coupled to a power source;

a second resistor coupled to the power source and arranged in parallel with said first resistor;

a first transistor having an emitter, a base and a collector, said emitter of said first transistor being coupled to said first resistor;

a third resistor coupled between the collector of said first transistor and ground;

a second transistor having an emitter, a base and a collector, said base of said second transistor being coupled to said base of said first transistor and to a junction between said collector of said first transistor and said third resistor, said emitter of said second transistor being coupled to said second resistor; and a fourth resistor coupled to said collector of said second transistor, a junction between said fourth resistor and said collector of said second transistor being coupled to said feedback control input of said control and power supply means.

9. The circuit according to claim 8, wherein said transistor switch comprising a field effect transistor having a drain, a gate and a source, and wherein said emitter of said first transistor is coupled to a junction between said drain of said field effect transistor and said first resistor.

* * * * *